United States Patent
Conboy et al.

(10) Patent No.: US 6,625,556 B1
(45) Date of Patent: Sep. 23, 2003

(54) WAFER ROTATION RANDOMIZATION FOR PROCESS DEFECT DETECTION IN SEMICONDUCTOR FABRICATION

(75) Inventors: Michael R. Conboy, Austin, TX (US); Sam H. Allen, Jr., New Brunfels, TX (US); Elfido Coss, Jr., Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/521,047

(22) Filed: Mar. 8, 2000

(51) Int. Cl.$^7$ .................... G01C 19/18; G01R 31/265; H01L 21/66
(52) U.S. Cl. .................... 702/84; 438/14; 355/53; 355/72
(58) Field of Search .................... 438/14; 702/33, 702/34, 84, 150, 151; 250/492.21; 716/19, 25; 355/53, 72

(56) References Cited

U.S. PATENT DOCUMENTS

| | | | | |
|---|---|---|---|---|
| 5,463,459 A | * | 10/1995 | Morioka et al. | 356/237.5 |
| 5,479,108 A | * | 12/1995 | Cheng | 324/765 |
| 5,511,005 A | * | 4/1996 | Abbe et al. | 702/84 |
| 5,511,934 A | * | 4/1996 | Bacchi et al. | 414/783 |
| 5,513,948 A | * | 5/1996 | Bacchi et al. | 414/783 |
| 5,698,038 A | * | 12/1997 | Guldi et al. | 134/1 |
| 6,021,380 A | * | 2/2000 | Fredriksen et al. | 702/35 |
| 6,027,301 A | * | 2/2000 | Kim et al. | 414/416.09 |
| 6,180,424 B1 | * | 1/2001 | Tigelaar et al. | 438/14 |
| 6,331,885 B1 | * | 12/2001 | Nishi | 355/53 |
| 6,359,678 B1 | * | 3/2002 | Ota | 355/53 |
| 6,400,445 B2 | * | 6/2002 | Nishi et al. | 355/72 |

* cited by examiner

Primary Examiner—John Barlow
Assistant Examiner—John Le

(57) ABSTRACT

The detection of a processing deviation in a multiple stage wafer processing system is achieved by assigning individual wafers a set of positional coordinates each time the wafer moves within the wafer processing system. In an example embodiment, a wafer is placed into a first processing stage and it is rotated to a certain angle of rotation. As the wafer moves from one processing stage to another the wafer is given a different angle of rotation; both the rotation angle and the wafer location are then recorded as a set of positional coordinates. The processed wafer is examined for surface deviations arising from variations in the processing parameters. The positional coordinates are used to develop a wafer movement map that aids in identifying the processing stage location where the deviation in the processing parameters occurred. An important advantage is the increased processing deviation traceability that the method brings to wafer processing.

32 Claims, 5 Drawing Sheets

WAFER ROTATION RANDOMIZATION FOR PROCESS DEFECT DETECTION IN SEMICONDUCTOR FABRICATION

FIELD OF THE INVENTION

The present invention generally relates to processing of material in a manufacturing plant and, more particularly, to methods and systems for tracking the movement of wafers in a semiconductor processing plant.

BACKGROUND OF THE INVENTION

Conventional manufacturing plants move material to be processed through a manufacturing process having several processing areas. Currently these material lots are tracked in larger quantities that may be disposed in a carrier for ease of movement throughout the facility.

Some manufacturing processes require that the item being processed be rotated regularly in order to ensure that the item is properly processed, such as when painting an object or when applying a coating to a substrate. In the case of a mechanical process, the object is rotated to ensure that the tooling is being worn evenly or that the tooling is mechanically treating the object evenly. Even though some of these items may be individually processed, or processed in small lots, the items may form part of a larger lot being manufactured and it is difficult to distinguish the progress of the individual item as it moves through the processing line. As the number of processing steps increase tracking becomes even more difficult. This is particularly a problem in the processing of wafers in a semiconductor processing plant.

A conventional semiconductor fabrication plant typically includes multiple fabrication areas or bays interconnected by a path, such as a conveyor belt. Each bay generally includes the requisite fabrication tools (interconnected by a subpath) to process semiconductor wafers for a particular purpose, such as photolithography, chemical-mechanical polishing or chemical vapor deposition, for example. Material stockers or stocking tools generally lie about the plant and store semiconductor wafers waiting to be processed. Each material stocker typically services two or more bays and can hold hundreds of cassettes. The wafers are usually stored in cassettes in groups of about 25 wafers. The wafers are then disposed within a carrier and move from one process to another in the carrier. The carriers are usually tracked by their carrier code by a computer system as they move through the plant.

Once a lot has been retrieved, and the equipment has been set up, the operation on the wafers by a particular piece of equipment, or "tool," can begin. At this point, the lot is "moved-in" to the operation. An operator on the line then communicates this information to the host computer. The lot remains in this state until the operation is completed. Once the operation is completed, the operator must perform tests and verifications on the wafers. When all tests and verifications have been performed, the host computer application program must be notified. Wafers may have moved from one cassette to another as a result of the operation; therefore the host application and computer has to be notified of these moves. The operator then places the cassette of "moved-out" wafers in the material stocker to await orders as to the location of the next piece of equipment that will perform operations on the wafers.

The semiconductor fabrication plant, including the bays, material stockers and the interconnecting path, typically operates under control of a distributed computer system running a factory management program. In this environment, the automated material handling system (AMHS) may conceptually include the cassettes, the transportation system (e.g., paths) and control system (e.g., the distributed computer system). An empty carriers management system as well as a separate test wafer management system may also form part of the AMHS.

Data gathered during the course of wafer processing is used to diagnose yield problems and forms the basis of yield improvement efforts. Such data includes parametric electrical test data gathered on individual circuits and test structures fabricated on the wafers, as well as wafer sort data which tests the suitability for use of the wafers once wafer processing is completed. One of the possible sources of yield variation is the order in which wafers in a lot are processed at a given processing step. When the processing is done one wafer at a time per step, a variation in yield may be caused by a build up of contaminants, uneven heating of a processing chamber or another physical aspect that changes during the processing of the lot. In a batch operation, the physical location of the wafer in the batch processing equipment may influence uniformity of the processing effects across the lot. In an example where wafers are moving through a contaminated chamber, if the order in which each wafer is processed is known then the final wafer yield may be plotted against the processing order in this step. For each wafer in a lot a drop-off in yield versus processing order would be observed due to the contamination problem. This data is used to make adjustments to the line to improve yield; however, this wafer tracking method lacks the level of precision in the data collected required by chip plants today.

In tracking the wafer processing order, specialized equipment has been used to read scribed wafer identifiers, either immediately prior to or after critical processing steps, and to store this data for later correlation with device performance. Randomizing the order of the wafers prior to such steps is often done to ensure effects are not compounded. The wafer positional data is fed into a computer system, the device performance metrics for a wafer lot of interest are manually entered, and then all possible graphs of the device metrics for that lot versus wafer processing order at each step are generated. The data is then reviewed to determine those steps at which the processing order may affect performance. This type of approach to tracking wafers can be costly in its implementation due to the amount of hardware and software needed to randomize the wafer order and interface with the wafer processing system's main computer database.

SUMMARY OF THE INVENTION

The present invention is directed to addressing the above and other needs in connection with improving traceability and yield of wafers as they move through a multiple step process.

In the case of multiple stage wafer processing, once the wafer is presented at the start of the processing line the opportunity to track the individual wafer and the wafer's progress is no longer available. In view of the above, there is a need to implement a wafer tracking method that has a high level of precision as an individual wafer is moving within a multiple stage processing line. There is also a need to implement a wafer tracking system that provides a feedback component for making adjustments on the processing parameters.

According to one aspect of the invention, it has been discovered that wafer tracking in a multiple stage processing line can be improved by rotating a wafer and recording the rotation angle and the wafer's location in the processing line each time the wafer moves. Each bit of data collected represents a set of coordinates that is used to develop a wafer movement map for correlating with other wafer movement maps to identify processing locations or tooling that are causing deviations to occur on the wafer surface. It has also been discovered that the yield of successively processed wafers is improved by integrating into the processing system an in-situ feedback component for adjusting processing parameters of earlier processing stages.

According to another aspect of the invention, a method for detecting a processing deviation in a multiple stage wafer processing system, having at least two processing parameters, includes determining an angle of rotation of a wafer as the wafer is presented to various stages of processing. The rotation angle and the wafer's corresponding location are recorded each time the wafer moves to another stage in the processing line. After the wafer is processed the wafer is analyzed for any surface deviations. Any wafer surface deviations are then correlated to at least one of the processing parameters and to at least one processing location within the wafer processing system.

According to another aspect of the invention, a system detects a processing deviation in a multiple stage wafer fabrication process having at least two processing parameters. The system includes a scanning device that determines an incoming angle of rotation of a wafer as it moves into a first processing stage and determines a translation angle as the wafer is within the first stage. A rotating device for rotating the wafer to an outgoing angle of rotation as the wafer is exiting the first stage and moving into a second processing stage. A computer arrangement is included that records each angle of rotation and a corresponding processing location of the wafer as the wafer moves through each stage of wafer processing. An analyzer arrangement detects deviations in the processed wafer while the computer arrangement performs a correlation analysis of the wafer data to correlate the wafer deviations to at least one of the processing parameters and processing location within the processing system.

In yet another aspect of the invention, a method for detecting a processing deviation in a multiple stage wafer processing system, having at least two processing parameters, includes determining an angle of rotation on a wafer as it is presented to various processing stages. A processing recipe is applied to the wafer as it is moving through the various processing stages. The angle of rotation of the wafer and a corresponding processing location of the wafer is recorded as the wafer moves through each stage of the wafer processing system. Mid-way through, or at the end of, wafer processing the wafer is analyzed for any deviations in relation to the processing recipe to determine the existence of a processing deviation from the recipe. The data gathered from the wafer deviation analysis is then correlated to at least one of the processing parameters and at least one of the processing locations within the wafer processing system The above summary of the present invention is not intended to describe each illustrated embodiment or every implementation of the present invention. The figures in the detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is generally directed to a method and system for tracking a wafer in a multiple stage wafer processing system. The invention is particularly suited for finding deviations from the processing parameters that may manifest themselves on the wafer surface or in the wafer structure. While the present invention is not necessarily limited to a wafer processing application the invention will be better appreciated using a discussion of exemplary embodiments in such a specific context.

In an example embodiment, a method of detecting a processing deviation in a multiple step wafer processing system includes presenting a wafer to various processing stages and rotating the wafer each time to a certain angle of rotation. The rotation angle is either a predetermined angle increment every time, such as 10 degrees, or a random angle increment, so long as the rotation angle per wafer is tracked. As the wafer moves from one location to another within the processing line the wafer is given a different angle of rotation and the wafer location is then recorded. The wafer coming off the line is examined to determine if there are any surface or structural deviations that indicate that there was a variation in the processing parameters. Since the movement of the wafer through the processing line is mapped, the map is used as an analysis tool to identify the processing parameter, and to locate the processing location, that caused the deviation in the wafer.

Figure 1:
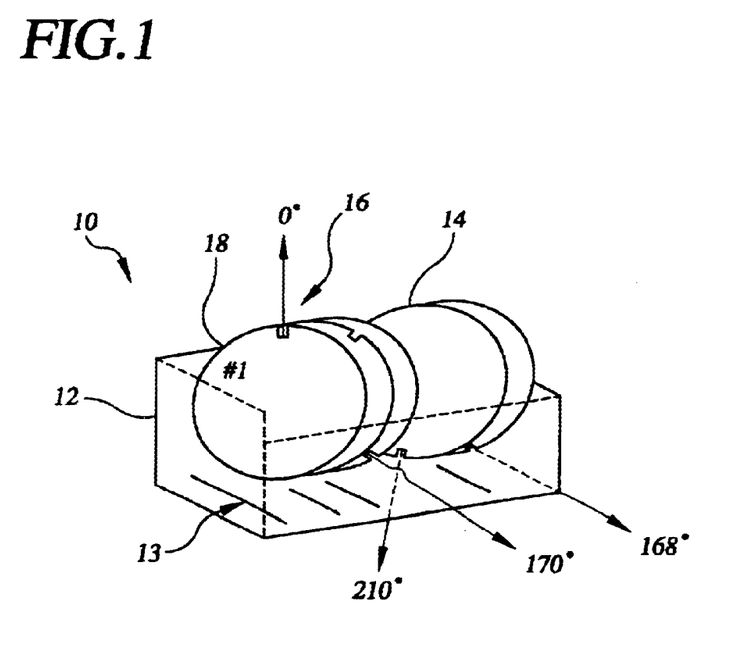
FIG. 1 is a carrier having a set of wafers arranged in accordance with one embodiment of the invention.

Referring now to the figures, FIG. 1 illustrates a wafer lot 10 arranged in a carrier 12 in accordance with one embodiment of the invention. Carrier 12 has a series of slots 13 that hold individual wafers 14 therein for movement through the wafer processing system. Wafers 14 have a slot or notch 16 located along the circumference that serves as a point of reference. In this example, slot 16 is at 0° degrees and serves as the starting point from which the wafer is rotated axially. The wafers are rotated to different angles of rotation at the onset of processing, with the increment of angle rotation being either predetermined or random. Where the wafers are rotated randomly, each wafer is to have a distinct angle of rotation before moving through the process. In a related embodiment, where individual wafer data is not desired and only wafer lot data is of interest, the wafers have the same initial angle of rotation at the onset of wafer processing. Each wafer can have about 360 angles of rotation, of 1-degree increments, excluding the slot portion and the scribe portion.

In other manufacturing applications, it is important to identify the axis of rotation of the object and the starting or reference point from which the angle of rotation will be measured. For example, where the object is a thin film display panel, the axis of rotation is similar to that of a wafer in that the panel is flat and acts as a substrate while its being processed. In one instance, the panel has about 4 main angles of rotation due to the panel square shape.

Where the wafers are to be subjected to common process steps, such as heating in a furnace, the wafers are usually arranged in tubes. Since many tubes include up to 100 wafers, in this example each set of wafers is to have a distinct angle of rotation with respect to the adjacent wafer set. In a related example, each wafer has a distinct angle of rotation with respect to all of the wafers in the tube. Referring briefly to FIG. 1, each wafer also has a scribe or a code 18 located on the wafer for identifying the wafer. In addition, each carrier and cassette in the wafer processing system is also identified and tracked by an identification tag, such as a bar code, which is read by a sensor along the processing path.

Figure 2:
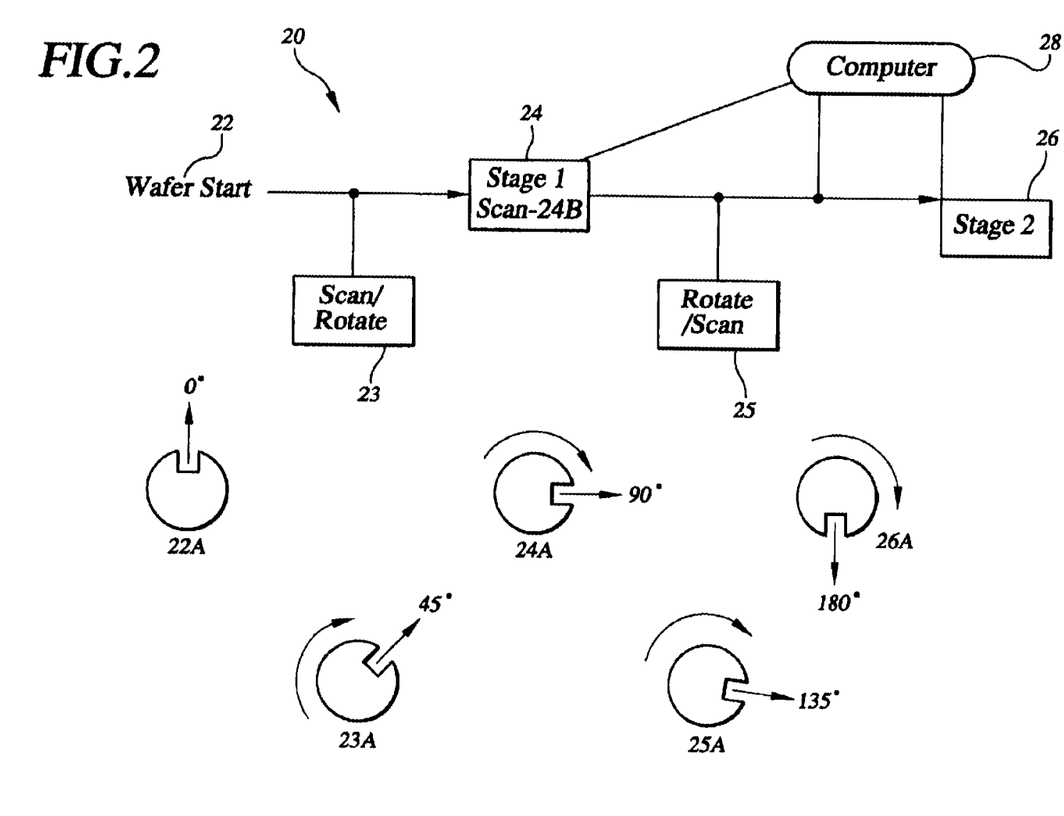
FIG. 2 is a process flow diagram of an example wafer processing line and the angles that the wafer is rotated to as the wafer moves through the processing line in accordance with one embodiment of the invention.

Referring now to FIG. 2, a process flow diagram exemplifies a wafer processing line 20 that has a computer arrangement coupled thereto. FIG. 2 also illustrates a wafer having different angles of rotation as it moves through the wafer process. The different angles of rotation correspond to the various steps of the process. At location 22, the wafer lot is started and wafer 22A has an initial angle of rotation of 0 degrees. The wafer is also identified at this point by its code and slot position in the carrier and this information is recorded in a computer arrangement 28. The movement of the wafer is tracked with this information and the successive angles of rotation are used to create a historical map of the movement of the wafer through the process.

In another embodiment, it is advantageous to impart an initial angle of rotation at 22A, either randomly or a predetermined angle. At location 23, the wafer is rotated to an angle of 45 degrees, now 23A, and scanned for identification. In this example, the rotation of the wafer is done with a wafer sorter that scans and sorts the wafers. The sorter identifies the wafer and the slot location and usually includes a robotic arm that imparts an angle of rotation on the wafer. The data that is generated after the scanning of the wafers is then recorded in the database of computer 28, with the computer being coupled to wafer processing line 20. Wafer 23A has an incoming angle of 45 degrees as it proceeds into the first stage of processing at location 24. A translation angle is added to the wafer due to the pick and place action (possibly by a robotic arm) that occurs as the wafer is removed from the carrier and placed into the first stage at location 24, resulting in wafer 24A. After the translation angle is added the wafer has an angle of rotation of 90 degrees. The wafer is scanned at 24B and the rotation angle is recorded in the computer database. Wafer 24A exits the first stage at location 24 and is again rotated another 45 degrees at location 25 to result in wafer 25A with an angle of rotation of 135 degrees. The new angle is scanned and recorded at computer 28 as the outgoing angle of the process. When the wafer moves into a second stage of processing at location 26 another translation angle is added to the wafer resulting in wafer 26A at 180 degrees.

Figure 3:
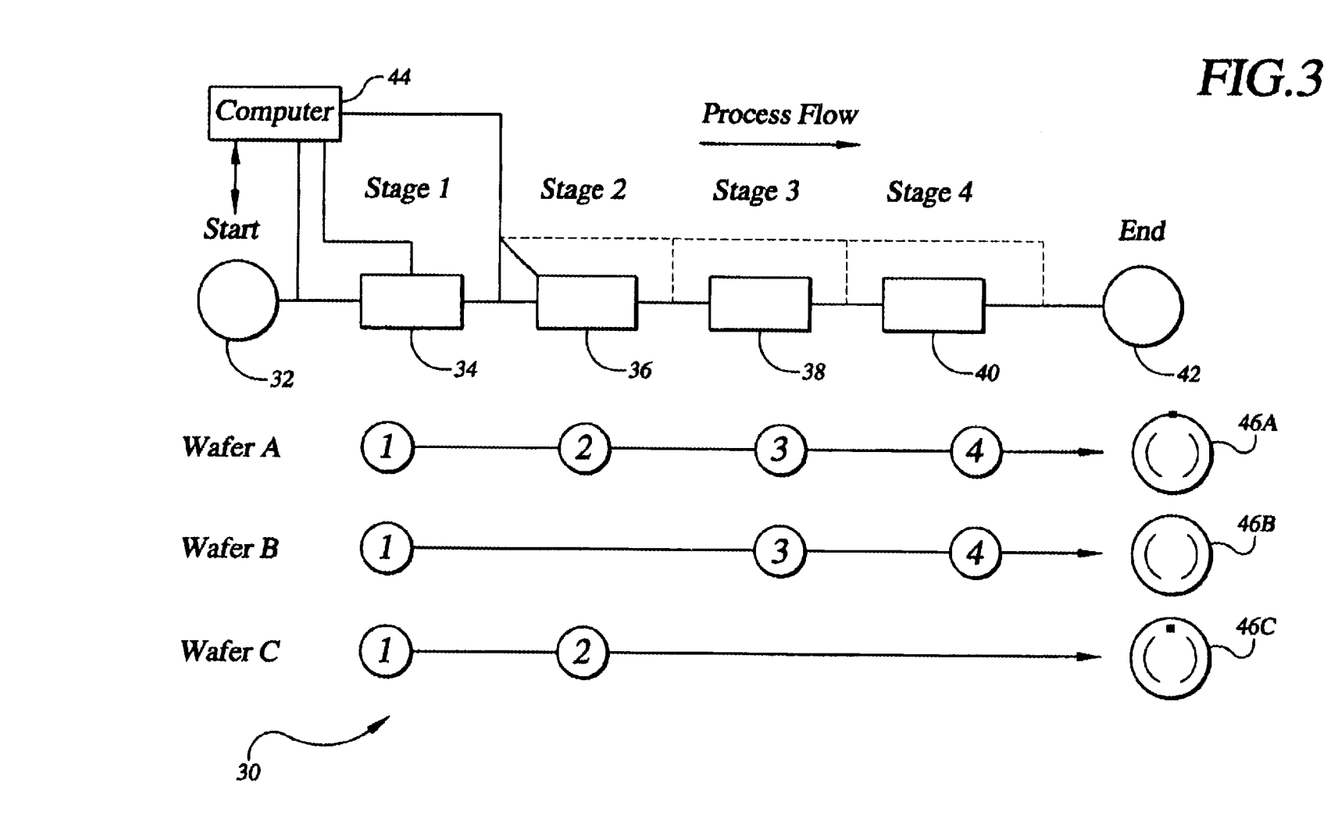
FIG. 3 is a process flow diagram of an example wafer processing line and the three wafers that move through different processing stages in accordance with one embodiment of the invention.

Referring to FIG. 3, a process flow diagram exemplifies a wafer processing line 30 is illustrated with three wafers (46A–46C) moving through the processing line. Wafer processing starts at 32 and proceeds through four processing locations 34, 36, 38 and 40 before coming to an end at 42. A computer 44 is coupled to the processing line at about every point in the processing line in order to collect data on the movement of wafers in the system. Wafer 46A moves through the processing line, as indicated by the numbers under the locations, and is moved through each stage of the processing line. In this example, angles of rotation are imparted upon every movement of wafer 46A through the processing line. The angle of rotation data is tied to the corresponding processing stage and tool and then this information is recorded in the computer.

FIG. 3 is also representative of three wafers 46A, 46B and 46C (or wafer lots) that move through the processing line with different recipes. The wafer recipe dictates the path that the wafer follows in the processing line. Although each set of wafers is required to be processed according to its own processing recipe, the group of wafers can have a common processing stage that the wafers will move through. In one example, the wafers go through the common processing stage of being heated by a furnace while disposed in a tube holding about 100 wafers. The wafers are arranged such that each set of wafers has a different angle of rotation with respect to the adjacent set of wafers. In another example, each wafer in the tube has a different angle of rotation that is distinct from any other wafer. In a related example, the process includes a scanning device for verifying that the angle of rotation of the wafers are distinct from each other before proceeding through the line.

Wafer processing starts at 32 and proceeds through four processing stages or locations 34, 36, 38 and 40 before coming to an end at location 42. A computer 44 is coupled to the processing line at about every point in the processing line in order to collect data on the movement of wafers in the system. Wafers 46B and 46C also move through the processing stages but follow different routes due to the lot sizes and the type of processing recipe applied to the wafers. Wafer 46B is processed through processing stages 34, 38 and 40. The angle of rotation data for wafer 46B differs from that of wafer 46C in that more angles of rotation are imparted due to the fact that more processing steps are involved. As a whole, the set of angles for wafer 46B than wafer 46C is also different due to the different path taken during processing. In both cases, the angles of rotation are tied to the processing stage and tool. The resultant movement data is then recorded in computer 44 in order to create the historical movement map of the wafer.

In a related embodiment, in the second stage of processing, location 36 represents a multiple chamber subsystem that the wafer is processed through. The multiple chamber subsystem has a number of tools and subprocess stages that impart additional angles of rotation on the wafer. The additional rotation angle data is also recorded as part of the mapping process. In a related embodiment, one of the chambers includes a rotating table device that is used to create a balanced subprocess, such as wafer coating. The current invention integrates the rate of rotation of the table into the calculations of the rotation angles of rotation and records this data in the movement map of the wafer.

One example application of the present invention is the correlation of processing deviations, evidenced in processed wafers, back to the processing parameters and the processing system to determine where the variance in processing parameter occurred. Wafers 46A and 46B illustrate two curved lines, known as "smiles", disposed on the wafer surface indicating that the deviation or, in this case, a defect has been caused by a processing stage or tooling. As another example, wafer 46A and wafer 46C have blemishes similarly located on the surface (dark spot on top) indicating that the wafer processing system has deviated or is out of tolerance. The external wafer movements of the wafer moving from one processing stage to another are mapped as illustrated by Tables 1–3. The tables aare used as an analyses tool for correlating back through the processing system to find the processing location and processing parameter(s) that caused the deviation that is seen on the wafer surface or is detected in the wafer structure due to a failure in performance. As illustrated below, each wafer is tracked by its wafer identification code, by carrier and the slot location:

TABLE 1

Wafer 46A Movement Map

WAFER 46A   CARRIER 1   SLOT 1

| Step | Processing Stage | Tool | Rotation Angle (degrees) | Processing Parameter |
|---|---|---|---|---|
| 1 | Start (22) | | 0 | |
| 2 | Scan/Rotate (23) | Sorter 100 | 45 | Sorting |
| 3 | Stage 1(24) Scan (24B) | Rotation table 100 Robot Arm 100 | 90 | Deposition |
| 4 | Rotate/Scan (25) | Sorter 200 | 135 | |
| 5 | Stage 2 | Rotation table 200 | 180 | Etch |
| 6 | Stage 3 | Tool 300 | 190 | Deposition |
| 7 | Stage 4 | Tool 400 | 200 | CMP |

TABLE 2

Wafer 46B Movement Map

WAFER 46B   CARRIER 2   SLOT 2

| Step | Processing Stage | Tool | Rotation Angle (degrees) | Processing Parameter |
|---|---|---|---|---|
| 1 | Start (22) | | 0 | |
| 2 | Scan/Rotate (23) | Sorter 100 | 45 | Sorting |
| 3 | Stage 1 (24) Scan (24B) | Rotation table 100 Robot Arm 100 | 90 | Deposition |
| 4 | Stage 3 | Tool 300 | 100 | Deposition |
| 5 | Stage 4 | Tool 400 | 110 | CMP |

TABLE 3

Wafer 46C Movement Map

WAFER 46C CARRIER 3 SLOT 3

| Step | Processing Stage | Tool | Rotation Angle (degrees) | Processing Parameter |
|---|---|---|---|---|
| 1 | Start (22) | | 0 | |
| 2 | Scan/Rotate (23) | Sorter 100 | 45 | Sorting |
| 3 | Stage 1 (24) Scan (24B) | Rotation table 100 Robot Arm 100 | 90 | Deposition |
| 4 | Rotate/Scan (25) | Sorter 200 | 135 | |
| 5 | Stage 2 | Rotation table 200 | 180 | Etch |

Referring briefly to FIG. 3 and to Tables 1–3, wafers 46A and 46B appear to have a similar "smile" defect on the wafer surface. The data of Tables 1 and 2 is correlated to determine the location and the processing parameter (and process tool) that generated the defect. In this example, Stage 4 is common to both and is a chemical-mechanical polishing operation that is going out of tolerance. In the correlation analysis, each line of data in the tables is treated as a set of coordinates to help in locating common deviation points between wafers. Each wafer is subjected to the same process at a different angle but the correlation process arrives at the point where the processing deviation occurred by subtracting out each coordinate set until the data intersects. By way of another example, wafers 46A and 46C have a similar surface defect or blemish on the wafer. Computer 44 arrives at the point where the deviation in the processing parameters occurred and correlates the wafer movement data of both wafers.

In a related embodiment, the wafer movement data collected similar to Tables 1–3 can be used in-situ as a feedback component to improve the yield of wafers. Real time adjustments are made to the processing parameters going forward or back in the processing line, depending on the wafer status as it is exiting the current stage. In one example, where processing stage 3 deposits a layer that is too thick then the processing parameters of the CMP operation of processing stage 4 can be adjusted to remove more deposited material to compensate for the process deviation of stage 3. Now the wafer exiting processing stage 4 is back on track with respect to the processing recipe and its dimensions. The deviation information gathered from the wafer coming out of stage 3 is fed back into the computer in order to adjust the processing parameters of stage 3 before a succeeding wafer is processed. Processing parameter variations are correlated back to the processing recipe to ensure that the recipe is being followed. A variance from wafer dimensions also indicate that predetermined angles of rotation that are being set on the wafer are not being consistently maintained due to some mechanical problem with the rotating device.

Figure 4:
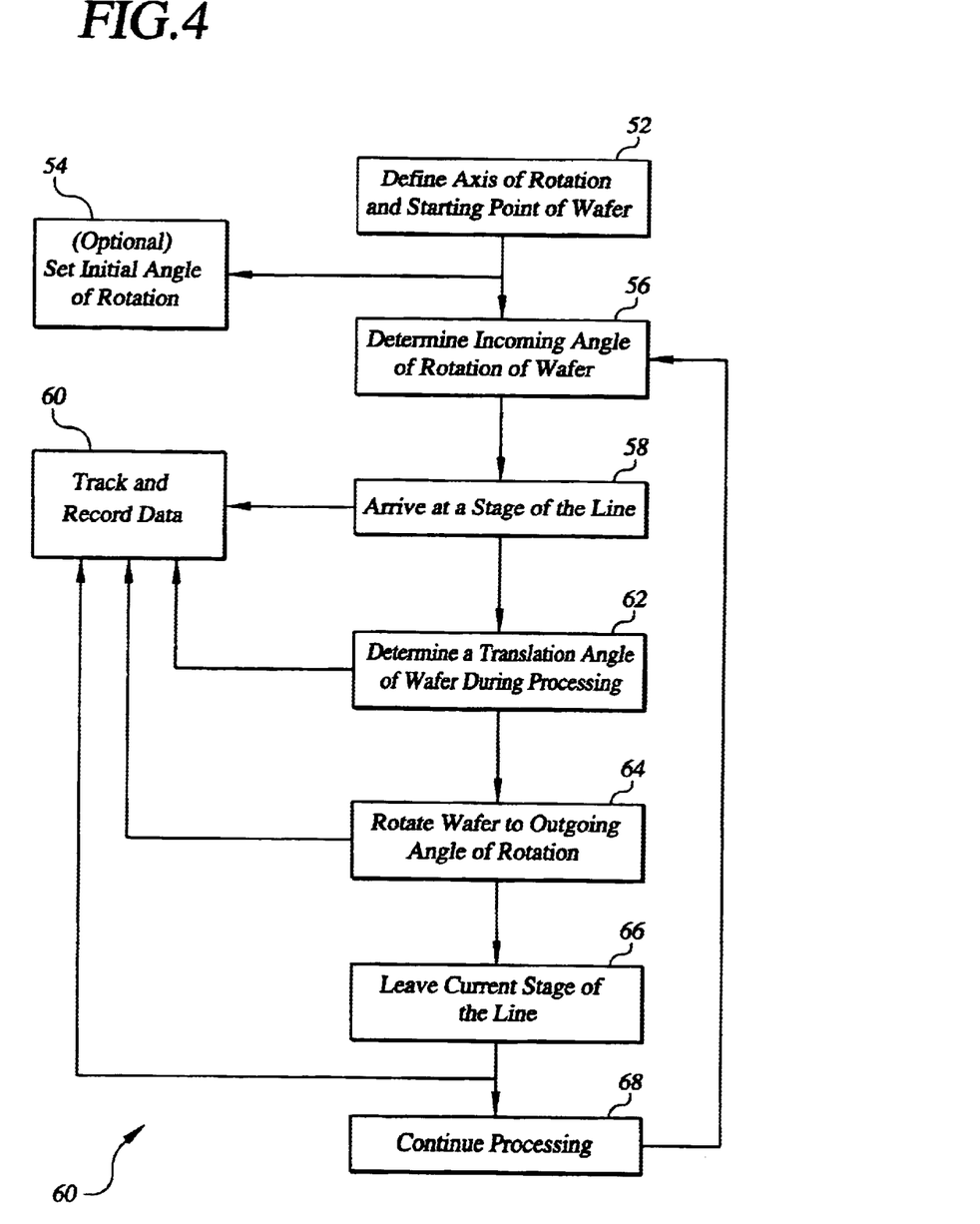
FIG. 4 is a flowchart of the manner in which wafers are rotated and tracked in a wafer processing line in accordance with one embodiment of the invention.

Referring to FIG. 4, flowchart 50 illustrates an example of the flow of the method of rotating a wafer in accordance with an embodiment of the present invention. At 52, the axis of rotation of the wafer is defined as well as the starting point of the wafer for measuring the subsequent angles of rotation. At 54, an optional step in processing includes imparting an initial angle of rotation on the wafer and recording the data in the database of computer arrangement 60. At 56, an incoming angle of rotation is defined for the wafer and this data is recorded at 60. The wafer now arrives at a first processing stage at 58. As the wafer is moved into the first processing stage, the action of picking up the wafer and placing it in the processing stage imparts a translation angle. The translation angle is then defined at 62 and recorded at 60. Once the processing at the first stage is complete, a mechanical arm or rotating table rotates the wafer to give it an outgoing angle of rotation at 64. The wafer then exits the first stage at 66 and continues to the second stage; the wafer location and rotation angle being recorded at 60. The flow repeats itself at 56 as the wafer is identified and the incoming angle of rotation of the wafer is determined and recorded. The flow is equally applicable to other items such as flat panel displays. An additional step in the flow can include an angle verification step to ensure that the wafers are at the angle of rotation that was originally intended.

Figure 5:
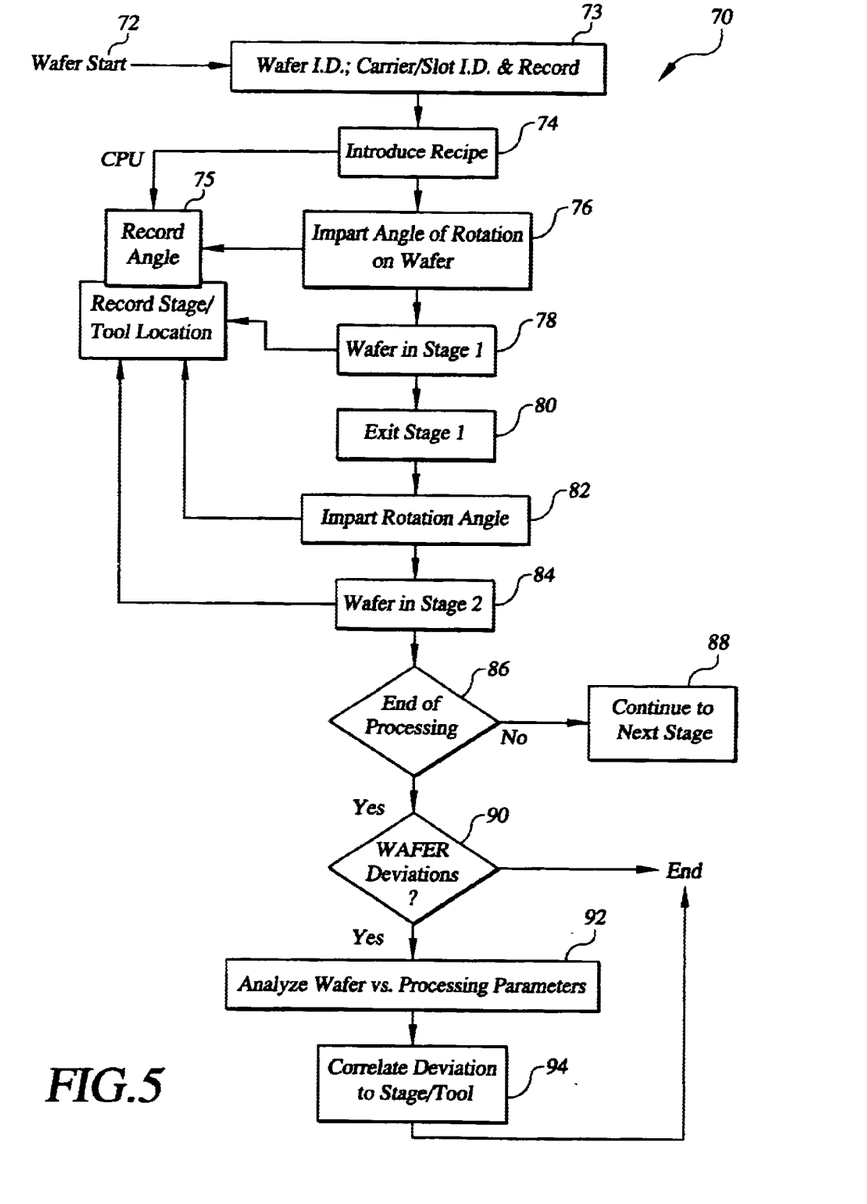
FIG. 5 is a flowchart of the manner in which wafers are tracked and processing deviations are detected in a wafer processing line in accordance with one embodiment of the invention.

Referring to FIG. 5, flowchart 70 illustrates an example of the process flow of the method of tracking a wafer in a multiple stage wafer processing system in accordance with an embodiment of the present invention. At 72, a wafer lot is presented into the processing line. At 73, the wafer identification code, carrier code and slot number are identified and recorded in a computer. At 74, a processing recipe is introduced into the process as a whole and it is then recorded in computer arrangement 75. At 76, an initial angle of rotation is given to the wafer and recorded in the database of the computer. At 78, the wafer is presented into the first processing stage 1 (see FIG. 3), and its location is recorded in computer 75. As the wafer is moved along the processing line the physical action of picking up the wafer and placing it in the next step in the process imparts a translation angle. The translation angle is then defined and recorded at computer 75.

Once processing within the processing stage 1 is complete at 80; a mechanical arm or rotating table rotates the wafer to give it an outgoing angle of rotation at 82 and after exiting processing stage 2 at 84. The wafer then exits the processing stage 2 and at 86 a decision is made whether wafer processing is complete. If processing is not complete, the process continues at 88 to another process step as per the recipe. If processing is complete, then an analysis is conducted at 90 on the wafer to determine if any deviations exist (such as wafer surface defects or part of the wafer structure is out of tolerance). If deviations do not exist then wafer processing for this wafer ends. If deviations exist, then the wafer is analyzed more closely against the processing parameters and, in this example, in relation to the recipe at 92. At 94, the deviation is correlated back to the processing stage/location (and processing tool) that caused the deviation. The correlation analysis is conducted by using the historical wafer movement maps of one or various wafers that exhibit similar deviations.

It is important that each movement of the wafer be recorded as a set of coordinates (e.g. rotation angle, corresponding wafer location in the system). The coordinates are then used in the development of the wafer movement map. Correlating the wafer deviation to at least one processing stage and processing parameters includes using the computer to develop the historical wafer movement map composed of the coordinates. Using the coordinate data, the computer then subtracts each set of coordinates to arrive at the processing location where the processing deviation (and defect) occurred.

In a related embodiment, the data is gathered in real time and is processed by the computer managing the wafer processing system. With the real time data, adjustments are made to the processing parameters going forward or back in the processing system. This aspect can immediately improve on the yield of wafers coming out of a multiple chamber system (such as a cluster tool) or the entire process. In a related embodiment, additional aspects of the processing system include devices for conducting rotation angle verification on the wafer, to ensure that the wafers are at the angle of rotation that was originally intended, and devices for detecting the movement of a rotation table (or carrier movement) within the line. The system also includes a wafer sorter for sorting wafers and presenting the wafers into the processing system with an optional incoming angle of rotation.

In some parts of the processing system, it is advantageous to stop rotating the wafers, such as in the photolithography area, due to alignment issues. However, upon completion the wafers are returned to the angle of rotation that they had prior to arriving to the photolithography area and then moved on to the next processing stage. In a related embodiment, a control system is included that captures wafer-processing data from prior production runs. The control system data is then shared with the computer arrangement of the rotation system and used to make adjustments up and down the line to improve processing of wafers. For instance, the angles of rotation that are being imparted on the wafers change due to some change in conditions on the line. The change is either externally or internally driven, but the change is now manageable with a feedback control loop that is integrated into the processing system.

As noted above, the present invention is applicable to a number of techniques for rotating and tracking material that is being processed in a manufacturing plant. Accordingly, the present invention is not necessarily being limited to the particular examples described above, but is intended to cover all aspects of the invention as fairly set out in the attached claims. For instance, while the rotation and tracking of wafers in a semiconductor facility is illustrated, other positional adjustments may be made to various objects during processing. These adjustments can lead to improvements in the product, in the manufacturing process or in the yield of product. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method for detecting a processing deviation in a multiple stage wafer processing system having at least two processing parameters, the method comprising:

determining an angle of rotation of a wafer as it is presented to a plurality of stages of wafer processing;

recording the angle of rotation of the wafer and a corresponding processing location of the wafer as the wafer moves through each stage of wafer processing;

analyzing the wafer for any deviations; and correlating the wafer deviation to at least one of the processing parameters and at least one of the processing locations within the wafer processing system.

2. The method of claim 1, wherein the step of recording rotation angles includes using a computer arrangement to develop a historical wafer movement map composed of a plurality of sets of coordinates, each set of coordinates including the angle of rotation and the corresponding processing location of the wafer.

3. The method of claim 2, wherein the step of recording includes recording an identification code disposed on the wafer.

4. The method of claim 1, wherein the step of determining rotation angles includes rotating the wafer to an angle of rotation that is selected from the group consisting of incoming, translation and outgoing angles of rotation.

5. The method of claim 1, further including the step of tracking and recording angles of rotation wafer data in connection with the wafer moving through a multiple chamber part of the processing system.

6. The method of claim 1, wherein the step of determining a rotation angle includes:
   determining an incoming angle of rotation of a wafer as the wafer is moving into a first processing stages; and
   determining an angle of translation of the wafer as the wafer is being processed in the first stage.

7. The method of claim 6, further including the step of rotating the wafer to an outgoing angle of rotation as the wafer is exiting the first processing stages.

8. The method of claim 1, further comprising rotating the wafer to a predefined incoming angle of rotation.

9. The method of claim 1, further comprising randomly rotating the wafer to an angle of rotation as it is presented to a plurality of stages of wafer processing.

10. A method for detecting a processing deviation in a multiple stage wafer processing system having at least two processing parameters, the method comprising:
    determining an angle of rotation of a wafer as it is presented to a plurality of stages of wafer processing;
    recording the angle of rotation of the wafer and a corresponding processing location of the wafer as the wafer moves through each stage of wafer processing including using a computer arrangement to develop a historical wafer movement map composed of a plurality of sets of coordinates, each set of coordinates including the angle of rotation and the corresponding processing location of the wafer;
    analyzing the wafer for any deviations; and
    correlating the wafer deviation to at least one of the processing parameters and at least one of the processing locations within the wafer processing system including subtracting the sets of coordinates to arrive at the processing location where the deviation occurred.

11. A method for detecting a processing deviation in a multiple stage wafer processing system having at least two processing parameters, the method comprising:
    determining an angle of rotation of a wafer as it is presented to a plurality of stages of wafer processing;
    recording the angle of rotation of the wafer and a corresponding processing location of the wafer as the wafer moves through each stage of wafer processing;
    analyzing the wafer for any deviations;
    correlating the wafer deviation to at least one of the processing parameters and at least one of the processing locations within the wafer processing system;
    generating data on the deviation from the processing parameters after the wafer exits a first processing stage;
    using the deviation data to adjust the processing parameters of a second processing stage before the wafer is moved into the second stage; and
    using the deviation data to adjust the processing parameters of the first processing stage before another wafer is moved into the first stage.

12. A method for detecting a processing deviation in a multiple stage wafer processing system having at least two processing parameters, the method comprising:
    determining an angle of rotation of a wafer as it is presented to a plurality of stages of wafer processing;
    recording the angle of rotation of the wafer and a corresponding processing location of the wafer as the wafer moves through each stage of wafer processing;
    analyzing the wafer for any deviations; and
    correlating the wafer deviation to at least one of the processing parameters and at least one of the processing locations within the wafer processing system including the steps of:
       conducting wafer deviation analysis to determine the portion of the wafer structure that has the deviation; and
       correlating the wafer structure portion to the processing stage location that caused deviation.

13. A method for detecting a processing deviation in a multiple stage wafer processing system having at least two processing parameters, the method comprising:
    determining an angle of rotation of a wafer as it is presented to a plurality of stages of wafer processing;
    recording the angle of rotation of the wafer and a corresponding processing location of the wafer as the wafer moves through each stage of wafer processing;
    analyzing the wafer for any deviations;
    correlating the wafer deviation to at least one of the processing parameters and at least one of the processing locations within the wafer processing system;
    applying a processing recipe to the wafer; and
    analyzing the wafer in relation to the processing recipe to determine the existence of a deviation from the recipe.

14. The method of claim 13, further including the steps of:
    generating data on any wafer deviation from the recipe after the wafer exits a first processing stage;
    using the data to adjust the processing recipe of a second processing stage before the wafer is moved into the second stage; and
    using the data to adjust the processing recipe of the first processing stage before another wafer is moved into the first stage.

15. A system for detecting a processing deviation in a multiple stage wafer processing system having at least two processing parameters, the system comprising:
    means for determining an angle of rotation on a wafer as the wafer is presented to a plurality of processing stages;
    means for recording the angle of rotation and a corresponding processing location of the wafer in the wafer processing system;
    means for analyzing the wafer for a deviation; and
    means for correlating the wafer deviation to at least one of the processing parameters and at least one of the processing locations within the wafer processing system.

16. A system for detecting a processing deviation in a multiple stage wafer processing system having at least two processing parameters, the system comprising:
    a scanning device for determining an incoming angle of rotation of a wafer as the wafer is moving into a first processing stage and determining a translation angle of the wafer as the wafer is within the first processing stage;
    a rotating device for rotating the wafer to an outgoing angle of rotation as the wafer is exiting the first stage and moving into a second processing stage;
    a computer arrangement for recording the angles of rotation and a corresponding processing location of the wafer as the wafer moves through each stage of wafer processing; and
    an analyzer arrangement that detects deviations in the processed wafer;

wherein the computer arrangement performs a correlation analysis of the wafer data to correlate the wafer deviations to at least one of the processing parameters and to at least one of the processing location within the processing system.

17. The system of claim 16, wherein the computer arrangement is adapted to develop a historical wafer movement map composed of a plurality of sets of coordinates, each set of coordinates including the angle of rotation and the corresponding processing location of the wafer.

18. The system of claim 16, further including a wafer carrier movement detector for determining the rate of rotation of the carrier moving within the processing system, the rate of rotation being recorded and incorporated into correlation analysis performed by the computer arrangement.

19. The system of claim 16, further including a multiple chamber subsystem that imparts additional angles of rotation on the wafer that are recorded in the computer arrangement.

20. The system of claim 16, further including a sorting apparatus for identifying the wafer and placing the wafer in a carrier slot with an incoming angle of rotation.

21. The system of claim 16, further including a control system coupled to the computer arrangement and adapted to share wafer processing data generated from prior production runs for use in correlation analysis.

22. A system for detecting a processing deviation in a multiple stage wafer processing system having at least two processing parameters, the system comprising:

a scanning device for determining an incoming angle of rotation of a wafer as the wafer is moving into a first processing stage and determining a translation angle of the wafer as the wafer is within the first processing stage;

a rotating device for rotating the wafer to an outgoing angle of rotation as the wafer is exiting the first stage and moving into a second processing stage;

a computer arrangement for recording the angles of rotation and a corresponding processing location of the wafer as the wafer moves through each stage of wafer processing adapted to develop a historical wafer movement map composed of a plurality of sets of coordinates, each set of coordinates including the angle of rotation and the corresponding processing location of the wafer and further adapted to subtract the sets of coordinates to arrive at the processing location where the deviation occurred in performing the correlation analysis; and an analyzer arrangement that detects deviations in the processed wafer, wherein the computer arrangement performs a correlation analysis of the wafer data to correlate the wafer deviations to at least one of the processing parameters and to at least one of the processing locations within the processing system.

23. A system for detecting a processing deviation in a multiple stage wafer processing system having at least two processing parameters, the system comprising:

a scanning device for determining an incoming angle of rotation of a wafer as the wafer is moving into a first processing stage and determining a translation angle of the wafer as the wafer is within the first processing stage;

a rotating device for rotating the wafer to an outgoing angle of rotation as the wafer is exiting the first stage and moving into a second processing stage;

a computer arrangement for recording the angles of rotation and a corresponding processing location of the wafer as the wafer moves through each stage of wafer processing adapted to develop a historical wafer movement map composed of a plurality of sets of coordinates, each set of coordinates including the angle of rotation and the corresponding processing location of the wafer, further adapted to subtract the sets of coordinates to arrive at the processing location where the deviation occurred in performing the correlation analysis and further adapted to process wafer deviation analysis data to determine the portion of the wafer structure that has the deviation and to correlate the deviation to the processing parameter and location causing the deviation; and an analyzer arrangement that detects deviations in the processed wafer, wherein the computer arrangement performs a correlation analysis of the wafer data to correlate the wafer deviations to at least one of the processing parameters and to at least one of the processing locations within the processing system.

24. A system for detecting a processing deviation in a multiple stage wafer processing system having at least two processing parameters, the system comprising:

a scanning device for determining an incoming angle of rotation of a wafer as the wafer is moving into a first processing stage and determining a translation angle of the wafer as the wafer is within the first processing stage;

a rotating device for rotating the wafer to an outgoing angle of rotation as the wafer is exiting the first stage and moving into a second processing stage;

a computer arrangement for recording the angles of rotation and a corresponding processing location of the wafer as the wafer moves through each stage of wafer processing;

an analyzer arrangement that detects deviations in the processed wafer, wherein the computer arrangement performs a correlation analysis of the wafer data to correlate the wafer deviations to at least one of the processing parameters and to at least one of the processing locations within the processing system; and a robotic mechanism for placing the wafer within one of the processing stages, the robotic mechanism imparting the translation angle on the wafer.

25. A system for detecting a processing deviation in a multiple stage wafer processing system having at least two processing parameters, the system comprising:

a scanning device for determining an incoming angle of rotation of a wafer as the wafer is moving into a first processing stage and determining a translation angle of the wafer as the wafer is within the first processing stage;

a rotating device for rotating the wafer to an outgoing angle of rotation as the wafer is exiting the first stage and moving into a second processing stage;

a computer arrangement for recording the angles of rotation and a corresponding processing location of the wafer as the wafer moves through each stage of wafer processing and adapted to analyze the wafer deviation in relation to a processing recipe to determine the existence of a deviation from the recipe; and an analyzer arrangement that detects deviations in the processed wafer, wherein the computer arrangement performs a correlation analysis of the wafer data to correlate the wafer deviations to at least one of the processing parameters and to at least one of the processing locations within the processing system.

26. A method for detecting a processing deviation in a multiple stage wafer processing system having at least two processing parameters, the method comprising:

determining an angle of rotation on a wafer as it is presented to a plurality of processing stages;

applying a processing recipe to the wafer;

recording the angle of rotation of the wafer and a corresponding processing location of the wafer in the wafer processing system;

analyzing the wafer for any deviations in relation to the processing recipe to determine the existence of a deviation from the recipe; and correlating the wafer deviation to at least one of the processing parameters and at least one of the processing locations within the wafer processing system.

27. The method of claim 26, further including the steps of:

generating data on any wafer deviation from the recipe after the wafer exits a first processing stage;

using the data to adjust the processing recipe of a second processing stage before the wafer is moved into the second stage; and using the data to adjust the processing recipe of the first processing stage before another wafer is moved into the first stage.

28. A method for detecting a processing deviation in a multiple stage wafer processing system having at least two processing parameters, the method comprising:

determining an angle of rotation of a wafer as it is presented to a plurality of stages of wafer processing including scanning the wafer for the orientation of a reference point on the wafer;

recording the angle of rotation of the wafer and a corresponding processing location of the wafer as the wafer moves through each stage of wafer processing;

analyzing the wafer for any deviations; and correlating the wafer deviation to at least one of the processing parameters and at least one of the processing locations within the wafer processing system.

29. A system for detecting a processing deviation in a multiple stage wafer processing system having at least two processing parameters, the system comprising:

a scanning device for determining an incoming angle of rotation of each of a plurality of wafers of a carrier as the carrier is moving into a first processing stage;

a rotating device adapted to rotate each wafer to a predefined incoming angle of rotation as the carrier is moving into a first processing stage, the rotating device being further adapted to rotate each wafer to an outgoing angle of rotation as the carrier is exiting the first stage;

a computer arrangement for recording the angles of rotation and a corresponding processing location of the wafers as the wafers move through each stage of wafer processing; and an analyzer arrangement that detects deviations in the processed wafers;

wherein the computer arrangement performs a correlation analysis of the wafer data to correlate respective wafer deviations to at least one of the processing parameters and to at least one of the processing location within the processing system.

30. The system of claim 29, wherein the rotating device is further adapted to rotate each wafer of the carrier to a predefined incoming angle of rotation distinct from the incoming angle of rotation of other wafers, the outgoing angle of rotation being a predetermined increment from the incoming angle of rotation for each wafer.

31. The system of claim 29, wherein the rotating device is further adapted to rotate each wafer of the carrier to the same predefined incoming angle of rotation, the outgoing angle of rotation for each respective wafer being selected randomly.

32. A system for detecting a processing deviation in a multiple stage wafer processing system having at least two processing parameters, the system comprising:

a scanning device for determining an incoming angle of rotation of each of a plurality of wafers of a carrier as the carrier is moving into a first processing stage;

a rotating device adapted to rotate each wafer to a predefined incoming angle of rotation as the carrier is moving into a first processing stage the rotating device being further adapted to rotate each wafer to an outgoing angle of rotation as the carrier is exiting the first stage and further adapted to rotate each wafer to a predefined incoming angle of rotation distinct from the incoming angle of rotation of other wafers of the carrier, the outgoing angle of rotation for each respective wafer being selected randomly;

a computer arrangement for recording the angles of rotation and a corresponding processing location of the wafers as the wafers move through each stage of wafer processing; and an analyzer arrangement that detects deviations in the processed wafers, wherein the computer arrangement performs a correlation analysis of the wafer data to correlate respective wafer deviations to at least one of the processing parameters and to at least one of the processing locations within the processing system.

* * * * *

UNITED STATES PATENT AND TRADEMARK OFFICE
CERTIFICATE OF CORRECTION

PATENT NO.    : 6,625,556 B1
DATED         : September 23, 2003
INVENTOR(S)   : Conboy et al.

It is certified that error appears in the above-identified patent and that said Letters Patent is hereby corrected as shown below:

Column 7,
Line 13, "aare" should read -- are --.
Line 13, "analyses" should read -- analysis --.

Signed and Sealed this

Eighteenth Day of November, 2003

JAMES E. ROGAN
*Director of the United States Patent and Trademark Office*